(12) United States Patent
Uraoka et al.

(10) Patent No.: US 10,916,661 B2
(45) Date of Patent: Feb. 9, 2021

(54) THIN FILM TRANSISTOR SUBSTRATE PROVIDED WITH PROTECTIVE FILM AND METHOD FOR PRODUCING SAME

(71) Applicant: Merck Patent GmbH, Darmstadt (DE)

(72) Inventors: Yukiharu Uraoka, Ikoma (JP);
Yasuaki Ishikawa, Ikoma (JP);
Naofumi Yoshida, Kakegawa (JP);
Katsuto Taniguchi, Kakegawa (JP);
Toshiaki Nonaka, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 28 days.

(21) Appl. No.: 16/463,511

(22) PCT Filed: Nov. 27, 2017

(86) PCT No.: PCT/JP2017/042381
§ 371 (c)(1),
(2) Date: May 23, 2019

(87) PCT Pub. No.: WO2018/097284
PCT Pub. Date: May 31, 2018

(65) Prior Publication Data
US 2019/0319131 A1    Oct. 17, 2019

(30) Foreign Application Priority Data
Nov. 28, 2016 (JP) .................................. 2016-230560

(51) Int. Cl.
*H01L 29/786* (2006.01)
*C08G 77/08* (2006.01)
(Continued)

(52) U.S. Cl.
CPC .......... *H01L 29/7869* (2013.01); *C08G 77/08* (2013.01); *G03F 7/012* (2013.01);
(Continued)

(58) Field of Classification Search
CPC .......... H01L 29/7869; H01L 21/02126; H01L 21/02216; H01L 21/324; H01L 29/66742;
(Continued)

(56) References Cited

U.S. PATENT DOCUMENTS

| 2011/0001190 A1 | 1/2011 | Ide et al. |
| 2011/0079778 A1 | 4/2011 | Yamazaki et al. |

(Continued)

FOREIGN PATENT DOCUMENTS

| JP | 2011-100980 A | 5/2011 |
| JP | 2015-146332 A | 8/2015 |

(Continued)

OTHER PUBLICATIONS

International Search Reporting from corresponding International Application No. PCT/JP2017/042381 dated Jan. 16, 2018.
(Continued)

*Primary Examiner* — Stephen W Smoot
*Assistant Examiner* — Vicki B. Booker
(74) *Attorney, Agent, or Firm* — Faegre Drinker Biddle & Reath (57) ABSTRACT

The present invention relates to providing a thin film transistor substrate containing a protective film, which can impart high driving stability. The thin film transistor substrate contains a thin film transistor and a protective film containing a cured product of a siloxane composition which covers the thin film transistor, wherein the thin film transistor has a semiconductor layer made of an oxide semiconductor, and wherein the siloxane composition contains polysiloxane, a fluorine-containing compound, and a solvent.

15 Claims, 1 Drawing Sheet

(51) Int. Cl.
*G03F 7/012* (2006.01)
*G03F 7/075* (2006.01)
*H01L 21/02* (2006.01)
*H01L 21/324* (2006.01)
*H01L 29/66* (2006.01)

(52) U.S. Cl.
CPC ...... *G03F 7/0757* (2013.01); *H01L 21/02126* (2013.01); *H01L 21/02216* (2013.01); *H01L 21/324* (2013.01); *H01L 29/66742* (2013.01); *H01L 29/78606* (2013.01)

(58) Field of Classification Search
CPC ............. H01L 29/78606; H01L 21/311; H01L 21/02282; C08G 77/08; C08G 77/24; G03F 7/012; G03F 7/0757; G03F 7/40; G03F 7/0755; G03F 7/0226; G03F 7/0007; G03F 7/0233; G03F 7/0046; C09D 183/04; C09D 183/08
See application file for complete search history.

(56) References Cited

U.S. PATENT DOCUMENTS

2018/0026141 A1  1/2018  Ikeda et al.
2019/0077961 A1* 3/2019  Takahashi ................ G03F 7/40

FOREIGN PATENT DOCUMENTS

WO   WO-2009-07523 A1    6/2009
WO   WO-2013-0187507 A1  12/2013
WO   WO-2016-152090 A1   9/2016

OTHER PUBLICATIONS

Written Opinion of the International Searching Authority from corresponding International Application No. PCT/JP2017/042381 dated Apr. 2, 2019.

* cited by examiner

THIN FILM TRANSISTOR SUBSTRATE PROVIDED WITH PROTECTIVE FILM AND METHOD FOR PRODUCING SAME

CROSS-REFERENCE TO RELATED APPLICATIONS

This application is a national stage application (under 35 U.S.C. § 371) of PCT/JP2017/042381, filed Nov. 27, 2017, which claims benefit of Japanese Application No. 2016-230560, filed Nov. 28, 2016, both of which are incorporated herein by reference in their entirety.

BACKGROUND OF THE INVENTION

Technical Field

The present invention relates to a thin film transistor substrate comprising a protective film and a method for manufacturing the same.

Background Art

Recently, for high-resolution display, development of a thin film transistor using an oxide semiconductor represented by amorphous InGaZnO has been actively conducted. As compared with amorphous silicon thin film transistor used in liquid crystal displays, oxide semiconductor has large electron mobility and exhibits excellent electrical properties such as large ON/OFF ratio, so that it is expected as a driving element of organic EL displays and power saving elements. In the development for display, it has especially become an important issue to maintain the device operation stability as a transistor and uniformity on a large area substrate. As the extremely important factor for the device operation stability, there is an insulating film that protects the oxide semiconductor layer from the outside atmosphere. However, as such an insulating film, a protective insulating film that has been utilized in a thin film transistor using a conventional amorphous silicon is mainly used (Patent Documents 1 and 2), so that there are fears of no enough use of the physical property that an oxide semiconductor essentially has. Then, this is believed to become one of the factors that limit the performance of the thin film transistor using an oxide semiconductor.

The protective film in an oxide semiconductor must be one that suppresses penetration of moisture, hydrogen and oxygen or the like. Infiltration of these impurities significantly change conductivity of the oxide semiconductor and inhibit the operation stability to invite threshold fluctuation etc. From this viewpoint, for conventional protective insulating films, SiOx, SiNx and SiONx mainly utilized chemical vapor deposition (CVD) or physical vapor deposition (PVD) such as sputtering are applied in a form of a single layer or multiple layers. The manufacturing process such as CVD etc. for forming these inorganic films having high barrier properties has fears of giving damage to the oxide semiconductor that is an underlying layer of a thin film transistor using an oxide semiconductor. Specifically, conventional protective films formed using a vacuum evaporation apparatus include $SiO_2$ film and SiN film. However, since these films are formed by decomposing the raw gas by means of plasma etc., in this forming process, there is a case where the ion species generated by the plasma give damage to the oxide semiconductor surface and deteriorate the film properties. Further, in the production of the oxide semiconductor device, it is concerned that the oxide semiconductor is further deteriorated by various chemicals or by processes such as dry etching. Therefore, as protection from the process, a protective film such as an etch stopper may be applied in conjunction (Patent Document 3). Further, in the case of adopting the film formation method, in which such a gas is used as a starting material, it was difficult to form a uniform protective film when producing a display having a large screen. Therefore, in order to solve this problem, forming a protective film by a coating method has been proposed. For example, a coating type protective film using siloxane resin has been also proposed (Patent Document 1); however, as to driving stability, there has been room for further improvement.

PRIOR ART DOCUMENTS

Patent Documents

[Patent document 1] JP No. 2015-146332 A

SUMMARY OF THE INVENTION

Problems to be Solved by the Invention

The present inventors have studied how to solve the problems as described above and obtained knowledge that by forming a protective film using a specific siloxane composition comprising a fluorine-containing compound and conducting appropriate additional heating and annealing after thermal curing, higher driving stability can be imparted to a thin film transistor substrate. The present invention has been made based on such a knowledge.

Accordingly, an object of the present invention is to provide a thin film transistor substrate comprising a fluorine-containing protective film, which can impart high driving stability.

Further, an object of the present invention is to provide a method for manufacturing a thin film transistor substrate comprising a fluorine-containing protective layer, which can more simply impart higher drive stability.

Further, another object of the present invention is to provide a siloxane composition to be used for the manufacturing method.

Means for Solving the Problems

The thin film transistor substrate according to the present invention comprises:
a thin film transistor; and
a protective film comprising a cured product of a siloxane composition, covering said thin film transistor,
wherein said thin film transistor has a semiconductor layer made of an oxide semiconductor,
where said siloxane composition comprises
a polysiloxane,
a fluorine-containing compound, and
a solvent, and
where said polysiloxane comprises a repeating unit represented by the following general formula (Ia):

wherein

$R^1$ is hydrogen, a monovalent to trivalent, straight-chain, branched or cyclic, saturated or unsaturated, aliphatic hydrocarbon group having 1 to 30 carbon atoms, or a monovalent to trivalent, aromatic hydrocarbon group having 6 to 30 carbon atoms, in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxy group or an alkoxy group, and one or more carbons are unsubstituted or substituted with silicon, and when $R^1$ is divalent or trivalent, $R^1$ connects the Si atoms each other, which are included in a plurality of the repeating units.

Further, the method for manufacturing the thin film transistor substrate according to the present invention comprises:

a step of preparing a siloxane composition comprising polysiloxane, a fluorine-containing compound and a solvent, wherein said polysiloxane comprises a repeating unit represented by the following general formula (Ia):

(Ia)

wherein $R^1$ is hydrogen, a monovalent to trivalent, straight-chain, branched or cyclic, saturated or unsaturated, aliphatic hydrocarbon group having 1 to 30 carbon atoms, or a monovalent to trivalent, aromatic hydrocarbon group having 6 to 30 carbon atoms, in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxy group or an alkoxy group, and one or more carbons are unsubstituted or substituted with silicon, and when $R^1$ is divalent or trivalent, $R^1$ connects the Si atoms each other, which are included in a plurality of the repeating units;

a step of coating a thin film transistor with said siloxane composition to form a protective film precursor layer;

a step of conducting thermal curing of said protective film precursor layer to form a protective film;

a step of conducting additional heating of the formed protective film; and a step of subjecting the thin film transistor comprising said protective film to annealing treatment.

Further, the siloxane composition for manufacturing the thin film transistor substrate according to the present invention comprises:

a polysiloxane;

a fluorine-containing compound, and a solvent, wherein said polysiloxane comprises a repeating unit represented by the following general formula (Ia):

(Ia)

where $R^1$ is hydrogen, a monovalent to trivalent, straight-chain, branched or cyclic, saturated or unsaturated, aliphatic hydrocarbon group having 1 to 30 carbon atoms, or a monovalent to trivalent, aromatic hydrocarbon group having 6 to 30 carbon atoms, in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxy group or an alkoxy group, and one or more carbons are unsubstituted or substituted with silicon, and when $R^1$ is divalent or trivalent, $R^1$ connects the Si atoms each other, which are included in a plurality of the repeating units.

Effects of the Invention

According to the present invention, it is possible to provide a thin film transistor substrate which exhibits high stability to voltage stress, light stress, and light and voltage stress. Further, according to the method of the present invention, a thin film transistor having high stability to stress can be easily produced, which has been difficult to be achieved in the conventional coating type protective film, and in addition, productivity can be also greatly improved since no vacuum apparatus or the like is needed in the manufacturing process. Further, according to the composition of the present invention, it is possible to form a protective film that has higher stability than the conventional coating type protective film.

DETAILED DESCRIPTION OF THE INVENTION

Mode for Carrying Out the Invention

Embodiments of the present invention are described below in detail with reference to the attached drawings.

Figure 1:
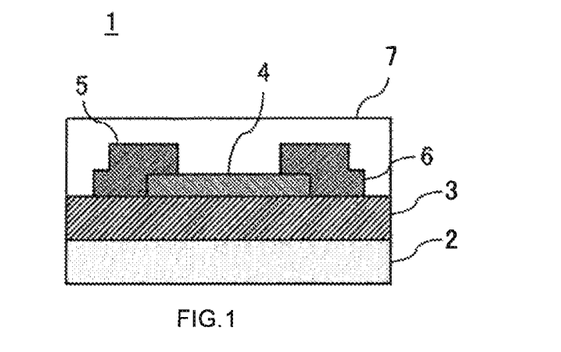
FIG. 1: a schematic diagram illustrating one embodiment (Example 1) of the thin film transistor substrate comprising a protective layer according to the present invention

First, one embodiment of a thin film transistor substrate 1 comprising a protective layer formed by the manufacturing method according to the present invention is illustrated in FIG. 1. In FIG. 1, a gate insulating layer 3 is formed on a gate layer 2, and a metal oxide semiconductor layer 4 is formed thereon. Further, a source electrode 5 and a drain electrode 6 are respectively formed in contact with the gate insulating layer 3 at both ends of the metal oxide semiconductor layer 4.

Figure 2:
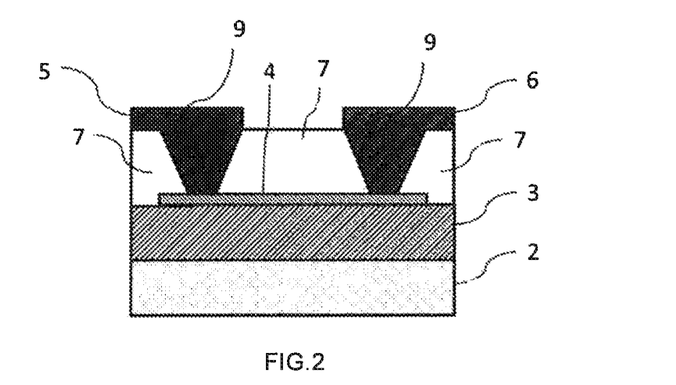
FIG. 2: a schematic diagram illustrating another embodiment of the thin film transistor substrate comprising a protective layer according to the present invention

In addition, although not shown in the drawing, an etch stopper may be formed on the metal oxide semiconductor layer 4. The protective film 7 is formed to cover these metal oxide semiconductor layer 4, source electrode 5 and drain electrode 6. As other embodiments, this can be similarly applied to, for example, a thin film transistor substrate (FIG. 2) having a structure including a source electrode 5 and a drain electrode 6 formed in contact with a metal oxide semiconductor layer 4 through a contact hole 9 being on a protective film 7, or a thin film transistor substrate having a top gate structure. Still more, the structures shown here are merely exemplified and it is also possible to manufacture a thin film transistor substrate having a structure other than those shown herein, by the manufacturing method according to the present invention.

Figure 3:
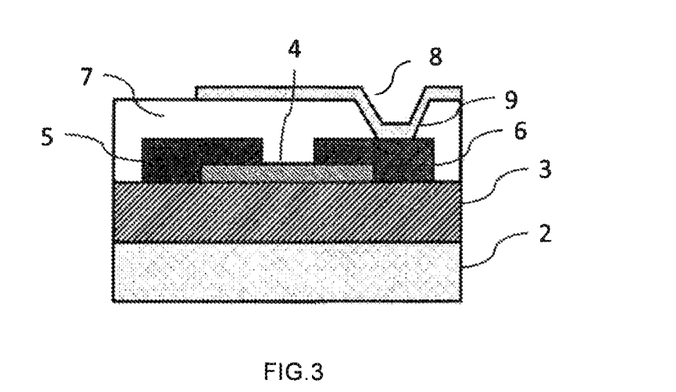
FIG. 3: a schematic diagram illustrating another embodiment of the thin film transistor substrate comprising a protective layer according to the present invention

In FIG. 3, one embodiment of a thin film transistor substrate provided with a pixel electrode 8 on a protective film 7 is shown. The pixel electrode 8 and a drain electrode 6 are contacting through a contact hole 9 formed in the protective film.

[Thin Film Transistor Substrate]

The thin film transistor substrate according to the present invention comprises a thin film transistor and a protective film comprising a cured product of a siloxane composition, covering the thin film transistor. The thin film transistor substrate according to the present invention may comprise a plurality of protective film, so that it may have a second protective film provided on a protective layer covering the thin film transistor. In the present specification, the thin film transistor means a device in general which constitutes a thin film transistor substrate such as substrates provided with an electrode, an electrical circuit, a semiconductor layer and an insulating layer on their surfaces. Further, the wiring disposed on the substrate includes a gate wiring, a data wiring, via wiring for connecting two or more wiring layers, or the like. As the oxide semiconductor layer, oxide semiconductors composed of indium oxide, zinc oxide and gallium oxide are general, but it may be other oxide if it exhibits semiconductor characteristics. The thin film transistor substrate according to the present invention is preferable in that it can obtain high protective properties especially by the oxide semiconductor and the annealing process. Conventionally, in order to allow the high temperature annealing, an inorganic film such as silicon oxide film or silicon nitride formed by PE-CVD method has been applied as a protective film, but a reactive ion etching, or the like was required to form a contact hole in the inorganic film. However, since the reactive ion etching greatly accelerates deterioration of oxide semiconductor, the annealing temperature to be described later was required to be raised to recover the semiconductor performance after processing. In the present invention, the protective film can suppress deterioration of a semiconductor and impart high driving stability to a thin film transistor.

The protective film in the thin film transistor substrate according to the present invention is formed from a siloxane composition comprising a polysiloxane, a fluorine-containing compound and a solvent. The components constituting the composition are described below in detail.

<Polysiloxane>

The polysiloxane means a polymer including a bond of Si—O—Si (siloxane bond) as a main chain. Further, in the present specification, silsesquioxane polymer represented by the general formula $(RSiO_{1.5})_n$ shall also be included as the polysiloxane.

The polysiloxane according to the present invention comprises a repeating unit represented by the following general formula (Ia):

wherein
$R^1$ is hydrogen, a monovalent to trivalent, straight-chain, branched or cyclic, saturated or unsaturated, aliphatic hydrocarbon group having 1 to 30 carbon atoms, or a monovalent to trivalent, aromatic hydrocarbon group having 6 to 30 carbon atoms,
in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxy group or an alkoxy group, and one or more carbons are unsubstituted or substituted with silicon, and
when $R^1$ is divalent or trivalent, $R^1$ connects the Si atoms each other, which are included in a plurality of the repeating units.

In the general formula (Ia), when $R^1$ is a monovalent group, $R^1$ includes, for example, (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl and 3,3,3-trifluoropropyl, (iv) fluoroaryl, (v) cycloalkyl, such as cyclohexyl, and (vi) nitrogen-containing groups having amino or, imide structure, such as isocyanate and amino. It is preferably methyl, ethyl, propyl, butyl, pentyl, hexyl, phenyl, tolyl, glycidyl and isocyanate. As fluoroalkyl, perfluoroalkyl is preferred, and trifluoromethyl and pentafluoroethyl are particularly preferred. The compound wherein $R^1$ is methyl is preferred since raw material thereof is easily obtained, it has high film hardness after curing and it has high chemical resistance. Further, phenyl is preferred since it increases solubility of the polysiloxane in the solvent and hardly cracks the cured film. It is preferable when $R^1$ has hydroxy, glycidyl, isocyanate or amino, since the adhesion to the substrate is improved.

Further, when $R^1$ is a divalent or trivalent group, $R^1$ preferably includes, for example, (i) groups obtained by removing two or three hydrogens from alkanes such as methane, ethane, propane, butane, pentane, hexane, heptane, octane and decane, (ii) groups obtained by removing two or three hydrogens from cycloalkanes such as cycloheptane, cyclohexane and cyclooctane, (iii) groups obtained by removing two or three hydrogens from aromatic compounds constituted only by a hydrocarbon such as benzene, naphthalene and benzene, and (iv) groups obtained by removing two or three hydrogens from nitrogen- and/or oxygen-containing cycloaliphatic hydrocarbon compound which contains an amino group, an imino group and/or a carbonyl group, such as piperidine, pyrrolidine and isocyanurate. More preferably, $R^1$ is the above (iv) to improve pattern reflow and increase adhesion to the substrate.

Preferably, $R^1$ is a linear, branched or cyclic, alkyl group or fluoroalkyl group having 1 to 20 carbon atoms or an aryl group or fluoroaryl group having 6 to 20 carbon atoms, in which one or more methylene may be replaced by oxygen. Here, the fluoroalkyl group referred to in the present specification means one in which one or more hydrogen atoms in the alkyl group are replaced by fluorine atoms, and the fluoroaryl group means one in which one or more hydrogen atoms in the aryl group are replaced by fluorine atoms.

$R^1$ includes, for example, a methyl group, an ethyl group, a propyl group, a butyl group, a pentyl group, a hexyl group, a heptyl group, an octyl group, a phenyl group, a benzyl group and their fluorine-substituted fluoroalkyl or fluoroaryl group. It is preferably a methyl group, an ethyl group, a propyl group, a butyl group, a pentyl group and a hexyl group, more preferably a propyl group, a butyl group, a pentyl group and a hexyl group. The fluoroalkyl group is preferably a perfluoroalkyl group, particularly preferably a trifluoromethyl group or a pentafluoroethyl group.

Further, the polysiloxane according to the present invention may optionally comprise a repeating unit represented by the following general formula (Ib):

(Ib)

The polysiloxane can be obtained by hydrolysis and condensation of a silane compound represented by the following formula (ia), optionally in the presence of an acidic catalyst or a basic catalyst, $$R^{1'}[Si(OR^a)_3]_p \qquad (ia)$$

wherein
p is 1 to 3,
$R^{1'}$ is hydrogen, a monovalent to trivalent, linear, branched or cyclic, saturated or unsaturated, aliphatic hydrocarbon group having 1 to 30 carbon atoms, or a monovalent to trivalent, aromatic hydrocarbon group having 6 to 30 carbon atoms,
in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxy group or an alkoxy group, and one or more carbons are unsubstituted or substituted with silicon, and
$R^a$ represents an alkyl group having 1 to 10 carbon atoms.

In the general formula (ia), preferable $R^{1'}$ is the same as the preferable $R^1$ described above.

In the general formula (ia), $R^a$ includes, for example, methyl, ethyl, n-propyl, isopropyl and n-butyl and the like. In the general formula (ia), more than one $R^a$ are included, and each $R^a$ may be identical or different.

Specific examples of the silicon compound represented by the general formula (ia) include, for example, methyl trimethoxysilane, methyl triethoxysilane, methyl triisopropoxysilane, methyl tri-n-butoxysilane, ethyl trimethoxysilane, ethyl triethoxysilane, ethyl triisopropoxysilane, ethyl tri-n-butoxysilane, n-propyl trimethoxysilane, n-propyl triethoxysilane, n-butyl trimethoxysilane, n-butyl triethoxysilane, n-hexyl trimethoxysilane, n-hexyl triethoxysilane, decyl trimethoxysilane, phenyl trimethoxysilane, phenyl triethoxysilane, trifluoromethyl trimethoxysilane, trifluoromethyl triethoxysilane, 3,3,3-trifluoropropyl trimethoxysilane, tris-(3-trimethoxysilylpropyl)isocyanurate, tris-(3-trimethoxysilylpropyl)isocyanurate, tris-(3-triethoxysilylpropyl)isocyanurate, tris-(3-trimethoxysilylethyl)isocyanurate, and the like. Among them, methyl trimethoxysilane, methyl triethoxysilane, methyl tripropoxysilane and phenyl trimethoxysilane are preferable.

The general formula (ia) is preferably the following formula (ia)'.

$$R^2Si(OR^3)_3 \qquad (ia)'$$

wherein
$R^2$ is a straight-chain, branched or cyclic alkyl group or fluoroalkyl group having 1 to 20 carbon atoms, in which one or more methylene may be replaced by oxygen, or an aryl group or fluoroaryl group having 6 to 20 carbon atoms, and
$R^3$ represents an alkyl group having 1 to 5 carbon atoms.

When the compound of the formula (ia) is used as the silane compound, it is possible to obtain polysiloxane containing only the repeating unit (Ia). In addition, it is also possible to obtain polysiloxane by combining the silane compound represented by the above formula (ia) with the silane compound represented by the following formula (ib). In this way, when the compound of the formula (ib) is used, it is possible to obtain polysiloxane containing repeating units (Ia) and (Ib).

$$Si(OR^a)_4 \qquad (ib)$$

wherein $R^a$ represents an alkyl group having 1 to 10 carbon atoms, preferably an alkyl group having 1 to 5 carbon atoms.

Here, the silane compounds (ia) and (ib) may be used in combination of two or more, respectively.

The mass average molecular weight of the polysiloxane is usually 800 to 15,000, and from the viewpoint of solubility in an organic solvent and solubility in an alkaline developer, it is preferably 1,000 to 10,000, more preferably 1,000 to 4,000, furthermore preferably 1,000 to 3,000. Here, the mass average molecular weight means a mass average molecular weight in terms of polystyrene, which can be measured by the gel permeation chromatography based on polystyrene.

By combining the composition of the present invention with a photosensitizer to be described later, a photosensitive siloxane composition can be prepared. In this case, it is preferable to use a combination of at least two types of polysiloxane having different alkali dissolution rate. As the polysiloxane having different alkali dissolution rate, it is preferable to use the following polysiloxane (I) and (II). The polysiloxane (I) is a polysiloxane obtained by hydrolysis and condensation of a silane compound represented by the following formula (ia) and optionally a silane compound represented by the formula (ib), in the presence of a basic catalyst. The film after prebaking of polysiloxane (I) is soluble in 5 mass % aqueous solution of TMAH, and dissolution rate of the film is 1,000 Å/sec or less, preferably 10 to 700 Å/sec. When solubility is 10 Å/sec or more, insolubles has extremely low possibility to remain after development, which is preferable in preventing disconnection or the like.

The polysiloxane (II) is a polysiloxane obtained by hydrolysis and condensation of a silane compound represented by the general formula (ia) and optionally a silane compound represented by the general formula (ib), in the presence of an acidic or basic catalyst. The film after prebaking of polysiloxane (II) is soluble in 2.38 mass % aqueous solution of TMAH, and dissolution rate of the film is 100 Å/sec or more, preferably 100 to 15,000 Å/sec. The dissolution rate of polysiloxane (II) can be selected from the range of 100 Å/sec to 15,000 Å/sec depending on the thickness of the objective protective film. It is more preferably 100 Å/sec to 10,000 Å/sec. By making it 15,000 Å/sec or less, the dissolution rate difference from the polysiloxane (I) is not too large, and then uniform development can be performed.

The polysiloxane (I) is very hard to cause "pattern" reflow at the time of thermal curing of the pattern after development; however, it cannot be used alone since the alkali solubility is very small. Further, even if alkali solubility of the polysiloxane (I) or polysiloxane (II) is adjusted for single use thereof, such stability of the pattern as one that may be indicated by the siloxane composition used to form the protective film in the present invention cannot be obtained. Therefore, it is preferable to use the combination of the polysiloxane (I) and the polysiloxane (II). In addition, when the dissolution rate difference is large, it is preferable to use a plurality of the polysiloxane (II) having different dissolution rate.

Although the content of the silane compound of said general formula (ib) in the polysiloxane (I) or the polysiloxane (II) can be appropriately set depending on the application, it is preferably 3 mol % to 40 mol % in each of the polysiloxane, and 5 mol % to 30 mol % is more preferably upon controlling hardness of the film and thermal stability of the pattern. By making the content 3 mol % or more, pattern stability at high temperature becomes better and making it 40 mol % or less, reaction activity is suppressed, and storage stability becomes better.

Polysiloxane used in the present invention is one having a branched structure since the compound of the general formula (ia) or (ib) is used as a starting material. Here, if necessary, by combining a bifunctional silane compound as a raw material for the polysiloxane, polysiloxane can be made to partially have a linear structure. However, in the applications where high temperature resistance is required, it is preferred that the linear structure portion is less. Specifically, the linear structure in polysiloxane derived from bifunctional silane is preferably not more than 30 mol % of the total polysiloxane structure.

<Measurement and Calculation Method of Alkali Dissolution Rate (ADR)>

Dissolution rate of the polysiloxane (I) or (II) in aqueous solution of TMAH is measured and calculated as described below.

First, polysiloxane is dissolved in propylene glycol monomethyl ether acetate (PGMEA) to make its content about 35 mass %. The solution is spin-coated on a silicon wafer to make a dry film thickness of about 2 μm and then the solvent is further removed by heating for 60 seconds on a hot plate of 100° C. Using a spectroscopic ellipsometer (Woollam Co.), the film thickness measurement of the coating film is conducted. Next, the silicon wafer having this film is immersed in 5% aqueous solution of TMAH in the case of the polysiloxane (I) or in 2.38% aqueous solution of TMAH in the case of the polysiloxane (II), at room temperature (25° C.) and the time until the film disappears is measured. The dissolution rate is obtained by dividing the initial film thickness by the time until the film disappears. When the dissolution rate is significantly slow, the film thickness measurement after immersion for a certain time is conducted and the dissolution rate is calculated by dividing the change amount of the film thickness before and after immersion by the immersion time.

In either polymer of the polysiloxane (I) or (II), the mass average molecular weight in terms of polystyrene is generally 800 to 15,000, preferably 1,000 to 10,000, more preferably 1,000 to 4,000, and furthermore preferably from 1,000 to 3,000. When molecular weight is within the range described above, resolution enough to prevent development residue from generating is obtained and sensitivity becomes good, so that it is preferable to adjust the molecular weight within the above range.

Although mixing ratio of the polysiloxane (I) and (II) can be adjusted at any ratio depending on the film thickness of the interlayer insulating film, sensitivity of the composition, resolution and the like, when the polysiloxane (I) is contained 10 mass % or more, effects preventing "pattern" reflow during the thermal curing are exhibited, so that this is preferred. Here, the "pattern" reflow means a phenomenon that a pattern is deformed upon heating the pattern and with respect to the pattern having, for example, rectangular cross-section and clear ridgeline, the ridge portion becomes round after heating and the nearly vertical side face having rectangular shape inclines.

<Fluorine-Containing Compound>

The siloxane composition used in the present invention comprises a fluorine-containing compound. Here, the fluorine compound is believed to release fluorine atoms by additional heating after thermal curing of the siloxane composition. And, it is supposed that the fluorine atoms diffuse into the protective film and on the surface of or into the layer of the semiconductor layer mainly in the course of additional heating, and, as a result, characteristics of the semiconductor device are remarkably improved.

Among such fluorine-containing compounds, preferred one is a fluorine-containing surfactant. As to the fluorine-containing surfactant, various ones are known and any of them are those having a fluorinated hydrocarbon group and a hydrophilic group. Examples of such a fluorine-containing surfactant includes MEGAFAC (trade name: manufactured by DIC Cooperation), FLUORAD (trade name, manufactured by Sumitomo 3M Limited), SURFLON (trade name, manufactured by Asahi Glass Co., Ltd.), and the like.

As the fluorine-containing compound, another preferred one is a compound represented by the following formula (M):

$$R^4Si(OR^5)_3 \quad\quad (M)$$

wherein $R^4$ is a completely or partially fluorine-substituted hydrocarbon group having 1 to 8 carbon atoms, and $R^5$ represents an alkyl group having 1 to 5 carbon atoms. This compound overlapps one having a fluoroalkyl group among those encompassed by the above-mentioned silane compound (ia). Specifically, it includes nonafluorohexyl trimethoxysilane, perfluorohexyl trimethoxysilane, perfluorooctyl trimethoxysilane, tridecafluoro-1,1,2,2-tetrahydrooctyl trimethoxysilane, and the like. In addition, the molecular weight of the fluorine-containing compound represented by the general formula (M) is preferably 1,000 or less.

Further, when the photosensitizer or curing promoter to be described later contains a fluorine atom in its structure, it can be regarded as a fluorine-containing compound. Although as such a photosensitizer or curing promoter, sulfonium salts and phosphonium salts etc. are sometimes used, those having a fluorinated hydrocarbon group as counter ions thereof are included. Such a photosensitizer or curing promoter also functions as the fluorine-containing compound.

The addition amount of the fluorine-containing compound is 0.05 to 10 mass %, preferably 0.1 to 1 mass %, based on the total mass of the siloxane composition.

In addition, although polysiloxane may contain fluorine in the present invention, such a fluorine-containing polysiloxane is not included in the fluorine-containing compound. This is considered because fluorine is hardly released from the fluorine-containing polysiloxane by the heat treatment during the curing and the subsequent additional heat treatment.

In the siloxane composition, the ratio of the number of fluorine atoms derived from the fluorine-containing compound to the number of silicon atoms derived from the polysiloxane is preferably 0.002 to 0.4. When this ratio is 0.002 or more, effects of the present invention are sufficiently exhibited. On the other hand, it is preferably 0.4 or less to maintain the performance of the semiconductor.

<Photosensitizer>

In the present invention, it is also possible to obtain a photosensitive siloxane composition by combining a photosensitizer with the siloxane composition. Using such a siloxane composition, there is an advantage that processing the protective film by exposure and development is possible, and since patterning by dry etching or the like is not needed, a damage to the thin film transistor performance is relatively small and annealing time can be made shorter. Such a photosensitive siloxane composition is described in detail below.

The photosensitive siloxane composition is classified into a positive type photosensitive siloxane composition and a negative type photosensitive siloxane composition depending on the type of photosensitizer. The preferable positive type photosensitive siloxane composition used to form a protective film in ae thin film transistor substrate according to the present invention comprises polysiloxane, a diazonaphthoquinone derivative as the photosensitizer, a solvent, and optionally a curing promoter. Such a positive type photosensitive siloxane composition forms a positive type photosensitive layer, in which exposed portion becomes soluble and thereby removed by development in an alkaline developer. On the other hand, the preferable negative type photosensitive siloxane composition used to form a protective film in a thin film transistor substrate according to the present invention comprises polysiloxane, a curing promoter capable of generating an acid or a base by light, and a solvent. Such a negative type photosensitive siloxane composition forms a negative type photosensitive layer, in which exposed portion becomes insoluble in alkaline developer and remains after development. The photosensitizer for each type is described below. In addition, when these photosensitizers are fluorine-containing compounds, they can function as the above-described fluorine-containing compound.

<Diazonaphthoquinone Derivative>

When the composition of the present invention is a positive type photosensitive composition, it is possible to use diazonaphthoquinone derivatives as the photosensitizer. Here, the diazonaphthoquinone derivative is a compound prepared by ester-bonding of naphthoquinone diazide sulfonic acid with a compound having a phenolic hydroxyl group, but not limited in particular with respect to structure, and preferably an ester compound with a compound having one or more phenolic hydroxyl groups. As the naphthoquinone-diazide sulfonic acid, 4-naphthoquinone diazide sulfonic acid or 5-naphthoquinone diazide sulfonic acid can be used. Due to the presence of absorption in the i-line (wavelength: 365 nm) region, the 4-naphthoquinone diazide sulfonic acid ester compound is suitable for i-line exposure. Furthermore, due to the presence of absorption at a wide range of wavelength region, the 5-naphthoquinone diazide sulfonic acid ester compound is suitable for exposure in a wide range of wavelength. Depending on the exposing wavelength, it is preferable to select the 4-naphthoquinone diazide sulfonic acid ester compound or the 5-naphthoquinone diazide sulfonic acid ester compound. It is also possible to use a mixture of the 4-naphthoquinone diazide sulfonic acid ester compound and the 5-naphthoquinone diazide sulfonic acid ester compound.

The compound having a phenolic hydroxyl group is not particularly restricted but includes, for example, the following compounds (trade name, manufactured by Honshu Chemical Industry Co., Ltd.).

Bisphenol A

BisP-AF

BisOTBP-A

Bis26B-A

BisP-MIBK

BisP-B

BisP-DEK

TekP-4HBPA

TrisP-TC

Although the optimum amount varies depending on esterification ratio of naphthoquinone diazide sulfonic acid, or properties of polysiloxane used, required sensitivity, and dissolution contrast between the exposed portion and the unexposed portion, the addition amount of the diazonaphthoquinone derivatives is, as the interlayer insulating film of the present invention, preferably from 3 to 20 parts by mass, more preferably 5 to 15 parts by mass based on 100 parts by mass of polysiloxane. If the addition amount of the diazonaphthoquinone derivative is 3 parts by mass or more, the dissolution contrast between the exposed portion and the unexposed portion becomes high and good photosensitivity is obtained. Further, in order to obtain better dissolution contrast, it is preferably 5 parts by mass or more. On the other hand, when the amount of the diazonaphthoquinone derivative is 20 parts by mass or less, the colorless transparency of the cured film is improved.

<Curing Promoter>

When the composition according to the present invention is a negative type photosensitive composition, a curing promoter is comprised therein, and when the composition is a positive type photosensitive composition, a curing promoter may be comprised therein. The curing promoter used is a compound which generates an acid or a base by light. These are selected depending on the polymerization reaction or crosslinking reaction utilized in the cured film manufacturing process. Here, the light may be visible light, ultraviolet ray or infrared ray. In particular, one which generates an acid or a base by the ultraviolet rays used in the manufacture of a thin film transistor is preferred.

Although the optimum amount varies depending on type of the active material that is generated by decomposition of the curing promoter, amount of the active material generated, required sensitivity, and dissolution contrast between the exposed portion and the unexposed portion, the addition amount of the curing promoter is preferably 0.001 to 10 parts by mass, more preferably 0.01 to 5 parts by mass based on 100 parts by mass of polysiloxane. If the addition amount of the curing promoter is 0.001 parts by mass or more, the dissolution contrast between the exposed portion and the unexposed portion becomes high and good photosensitivity is obtained. On the other hand, when the addition amount of the curing promoter is 10 parts by mass or less, colorless transparency of the cured film is improved because cracks into the coating film to be formed are suppressed and coloration due to decomposition of the curing promoter is also suppressed.

Examples of the photoacid generator include diazomethane compounds, triazine compounds, sulfonic acid esters, diphenyl iodonium salts, triphenyl sulfonium salts, sulfonium salts, ammonium salts, phosphonium salts, sulfonimide compounds, and the like. Among these photoacid generators, the preferable structure can be represented by the general formula (A).

$$R^+X^- \quad (A)$$

wherein $R^+$ represents an organic ion selected from the group consisting of hydrogen, an alkyl group, an aryl group, an alkenyl group, an acyl group and alkoxy groups, modified with a carbon atom or other hetero atom, and is, for example, diphenyliodonium ion and triphenylsulfonium ion.

Further, $X^-$ is preferably any one of the counter ions represented by the following general formulae.

$$SbY_6^-$$

$$AsY_6^-$$

$$R^a_p PY_{6-p}^-$$

$$R^a_q BY_{4-q}^-$$

$$R^a_q GaY_{4-q}^-$$

$$R^a SO_3^-$$

$$(R_a SO_2)_3 C^-$$

$$(R_a SO_2)_2 N^-$$

$$R^b COO^-$$

$$SCN^-$$

wherein
Y is a halogen atom,
$R^a$ is an alkyl group having 1 to 20 carbon atoms or an aryl group having 6 to 20 carbon atoms, which is substituted by a substituent selected from fluorine, a nitro group and a cyano group, and
$R^b$ is hydrogen or an alkyl group having 1 to 8 carbon atoms,
p is a number of 0 to 6, and q is a number of 0 to 4.

The specific counterion includes one selected from the group consisting of $BF_4^-$, $(C_6F_5)_4B^-$, $((CF_3)_2C_6H_3)_4B^-$, $PF_6^-$, $(CF_3CF_2)_3PF_3^-$, $SbF_6^-$, $(C_6F_5)_4Ga^-$, $((CF_3)_2C_6H_3)_4Ga^-$, $SCN^-$, $(CF_3SO_2)_3C^-$, $(CF_3SO_2)_2N^-$, a formate ion, an acetate ion, a trifluoromethanesulfonate ion, a nonafluorobutanesulfonic acid ion, a methanesulfonate ion, a butane sulfonic acid ion, a benzenesulfonic acid ion, a p-toluenesulfonate ion, and a sulfonic acid ion.

Particularly among the photoacid generators used in the present invention, those which generate sulfonic acids or boric acids are suitable, and they include, for example, tolylcumyliodonium tetrakis(pentafluorophenyl) borate (PHOTOINITIATOR2074 (trade name), manufactured by Rhodia), diphenyliodonium tetra(perfluorophenyl)borate, those composed of sulfonium ion in the cation portion and pentafluorophenylborate ion in the anion portion, and the like.

In addition to the above, they include triphenylsulfonium trifluoromethanesulfonate; triphenylsulfonium camphorsulfonate, triphenylsulfonium tetra(perfluorophenyl)borate, 4-acetoxyphenyl dimethyl sulfonium hexafluoroarsenate, 1-(4-n-butoxynaphthalene-1-yl)tetrahydrothiophenium trifluoromethanesulfonate, 1-(4,7-dibutoxy-1-naphthalenyl)tetrahydrothiophenium trifluoromethanesulfonate, diphenyliodonium trifluoromethane sulfonate, diphenyliodonium hexafluoroarsenate, and the like. Furthermore, it is also possible to use photoacid generators represented by the following formulae.

wherein
A is each independently a substituent selected from an alkyl group having 1 to 20 carbon atoms, an alkoxy group having 1 to 20 carbon atoms, an aryl group having 6 to 20 carbon atoms, an alkylcarbonyl group having 1 to 20 carbon atoms, an arylcarbonyl group having 6 to 20 carbon atoms, a hydroxyl group, and an amino group, p is each independently an integer of 0 to 5, and $B^-$ is a fluorinated alkyl sulfonate group, a fluorinated aryl sulfonate group, a fluorinated alkyl borate group, an alkyl sulfonate group and an aryl sulfonate group. Compounds formed by mutually replacing the cations and anions shown in these formulae and photoacid generators formed by combining said various cations or anions shown in these formulae with said various cations or anions can be also used. For example, those formed by combining any one of the sulfonium ions represented by the formulae and a tetra(perfluorophenyl)borate ion and those formed by combining any one of the iodonium ions represented by the formulae with tetra(perfluorophenyl)borate ion can be also used as the photoacid generator.

Including those described above, the photoacid generator includes, as one which can be specifically used, 4-methoxyphenyl diphenyl sulfonium hexafluorophosphonate, 4-methoxyphenyl diphenyl sulfonium hexafluoroarsenate, 4-methoxyphenyl diphenyl sulfonium methanesulfonate, 4-methoxyphenyl diphenyl sulfonium trifluoroacetate, triphenylsulfonium tetrafluoroborate, triphenylsulfonium tetrakis(pentafluorophenyl)borate, triphenylsulfonium hexafluorophosphonate, triphenylsulfonium hexafluoroarsenate, 4-methoxyphenyl diphenyl sulfonium-p-toluenesulfonate, 4-phenylthiophenyl diphenyl tetrafluoroborate, 4-phenylthiophenyl diphenyl hexafluorophosphonate, triphenylsulfonium methanesulfonate, triphenylsulfonium trifluoroacetate, triphenylsulfonium-p-toluenesulfonate, 4-methoxyphenyl diphenyl sulfonium tetrafluoroborate, 4-phenylthiophenyl diphenyl hexafluoroarsenate, 4-phenylthiophenyl diphenyl-p-toluenesulfonate, N-(trifluoromethylsulfonyloxy)succinimide, N-(trifluoromethylsulfonyloxy)phthalimide, 5-norbornene-2,3-dicarboxyimidyltriflate, 5-norbornene-2,3-dicarboxyimidyl-p-toluenesulfonate, 4-phenylthiophenyl diphenyl trifluoromethanesulfonate, 4-phenylthiophenyl diphenyl trifluoroacetate, N-(trifluoromethylsulfonyloxy)diphenyl maleimide, N-(trifluoromethylsulfonyloxy)bicyclo[2.2.1]hept-5-ene-2,3-dicarboxyimide, N-(trifluoromethylsulfonyloxy)naphthylimide, N-(nonafluorobutylsulfonyloxy)naphthylamide, and the like.

Examples of the photobase generator include polysubstituted amide compounds having an amide group, lactams, imide compounds, or those containing these structures.

Among these, hydrates or solvates of photobase generators represented by the following general formula (A) are preferable since they can improve the aging stability of the composition.

(A)

wherein x1 is an integer of 1 to 6, $R^{11}$ to $R^{16}$ are each independently a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonate group, an amino group, an ammonium group, an aliphatic hydrocarbon group having 1 to 20 carbon atoms, which may contain a substituent, an aromatic hydrocarbon group having 6 to 22 carbon atoms, which may contain a substituent, an alkoxy group having 1 to 20 carbon atoms, which may contain a substituent, or an aryloxy group having 6 to 20 carbon atoms, which may contains a substituent.

Among these, $R^1$ to $R^{14}$ are particularly preferably a hydrogen atom, a hydroxyl group, an aliphatic hydrocarbon group having 1 to 6 carbon atoms, or an alkoxy group having 1 to 6 carbon atoms, and $R^{15}$ and $R^{16}$ are particularly preferably a hydrogen atom.

Two or more of $R^{11}$ to $R^{14}$ may be bonded to form a cyclic structure. At this time, the cyclic structure may contain a hetero atom.

N is a constituent atom of the nitrogen-containing heterocyclic ring, and the nitrogen-containing heterocyclic ring has one or more hydroxyalkyl groups. The hydroxyalkyl group may be bonded to any position in the ring but is preferably bonded in the para-position or ortho-position. The nitrogen-containing heterocyclic ring may further include one or more aliphatic hydrocarbon groups that are different from said hydroxyalkyl, which have 1 to 20, particularly 1 to 6 carbon atoms and may contain a substituent. In the nitrogen-containing heterocyclic ring, when a hydroxyl group is contained in the substituent, solubility is made increased and the boiling point is made raised, so that this is preferred.

It is preferable to appropriately select $R^{11}$ to $R^{14}$ depending on the exposure wavelength to be used. In applications for display, a functional group to which an unsaturated hydrocarbon, such as a vinyl group and an alkynyl group, which make the absorption wavelength shifted to, for example, g, h or i-line, is bonded, and an alkoxy group, a nitro group, and the like are used. A methoxy group and an ethoxy group are particularly preferred.

Specific examples of the photobase generator represented by the formula (A), which is described above, include, for example, the followings.

PGB-1

PBG-2

PBG-3

PBG-4

PBG-5

Further, as the curing promoter, a thermal acid generator or a thermal base generator may be used. Examples of the thermal acid generator include salts or esters capable of generating an organic acid, for example, various aliphatic sulfonic acids and salts thereof, various aliphatic carboxylic acids, such as citric acid, acetic acid and maleic acid, and salts thereof, various aromatic carboxylic acids, such as benzoic acid and phthalic acid, and salts thereof, aromatic sulfonic acids and their ammonium salts, various amine salts, aromatic diazonium salts, and phosphonic acids and salts thereof. Among the thermal acid generators, in particular, salts composed of an organic acid and an organic base are preferred and salts composed of a sulfonic acid and an organic base are more preferred.

Preferred sulfonic acids include p-toluenesulfonic acid, benzenesulfonic acid, p-dodecylbenzenesulfonic acid, 1,4-naphthalenedisulfonic acid, methanesulfonic acid, and the like. These acid generators may be used individually or mixed together.

Examples of the thermal base generator include compounds that generate a base, such as imidazole, tertiary amine and quaternary ammonium, and mixtures thereof. Examples of bases to be released include imidazole derivatives, such as N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole, N-(4-chloro-2-nitrobenzyloxycarbonyl)imidazole, and 1,8-diazabicyclo[5.4.0]undecene-7. Like the acid generator, these base generators may be used individually or mixed together.

These thermal acid generators and thermal base generators can be used even if the composition is photosensitive and even if it is non-photosensitive but using them is preferred in order to get a fully cured film when the composition is non-photosensitive.

In addition, among these photosensitizers or curing promoters, those containing a fluorine atom in the structure thereof functions also as the fluorine compound described above.

<Solvent>

Examples of the solvent include ethylene glycol monoalkyl ethers, such as ethylene glycol monomethyl ether, ethylene glycol monoethyl ether, ethylene glycol monopropyl ether and ethylene glycol monobutyl ether; diethylene dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether and propylene glycol monoethyl ether; propylene glycol alkyl ether acetates, such as PGMEA, propylene glycol monoethyl ether acetate and propylene glycol monopropyl ether acetate; aromatic hydrocarbons, such as benzene, toluene and xylene; ketones, such as methyl ethyl ketone, acetone, methyl amyl ketone, methyl isobutyl ketone and cyclohexanone; and the like. These solvents are used individually or in combination of two or more, respectively. Blending ratio of the solvent varies depending on coating method or requirement of the film thickness after the coating. For example, in the case of spray coating, the ratio becomes 90 mass % or more based on the total mass of the polysiloxane and optional components, but in the case of slit coating of a large glass substrate used for manufacturing a display, it is usually 50 mass % or more, preferably 60 mass % or more, and usually 90 mass % or less, preferably 85 mass % or less.

<Other Optional Components>

Further, the photosensitive siloxane composition according to the present invention may contain other optional components as needed. Such optional components include a surfactant and the like. In addition, among the surfactants, those containing fluorine may function also as the fluorine-containing compound described above.

Using a surfactant is preferred since it can improve the coating properties. The surfactants which can be used in the siloxane composition of the present invention include nonionic surfactants, anionic surfactants, ampholytic surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol; polyethoxylate of acetylene alcohol; acetylene glycol derivatives, such as polyethoxylate of acetylene glycol; fluorine-containing surfactants, for example, FLUORAD (trade name, manufactured by Sumitomo 3M Limited), MEGAFAC (trade name: manufactured by DIC Cooperation), SURFLON (trade name, manufactured by Asahi Glass Co. Ltd.); or organosiloxane surfactants, for example, KP341 (trade name, manufactured by Shin-Etsu Chemical Co., Ltd.), and the like. Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol, and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid, and the like.

Further, examples of the amphoteric surfactant include 2-alkyl-N-carboxymethyl-N-hydroxyethyl imidazolium betaine, lauric acid amide propyl hydroxysulfone betaine, and the like.

These surfactants can be used individually or in combination of two or more, and the blending ratio thereof is usually 50 to 10,000 ppm, preferably 100 to 5,000 ppm, based on the total mass of the siloxane composition.

[Method for Manufacturing Thin Film Transistor]

The objective thin film transistor substrate can be obtained by applying the siloxane composition to a thin film transistor and heating to form a protective film (cured film), further conducting additional heating, thereafter, subjecting the thin film transistor having the protective film to annealing treatment. At that time, if a photosensitizer is mixed in the siloxane composition, it is also possible to form a pattern such as a contact hole by conducting exposure through a desired mask and development.

A method for manufacturing a thin film transistor substrate having an oxide semiconductor layer is described by use of TFT of bottom gate type shown in FIG. 1 as an example. A gate electrode 2 is patterned on a substrate made of glass or the like. The gate electrode material includes materials such as molybdenum, aluminum and aluminum alloys, copper and copper alloys, and titanium, which is constituted as a single layer thereof or a laminate film of two or more types thereof. A gate insulating film 3 is formed on the gate electrode. As the gate insulating film, typically a silicon oxide film, a silicon nitride film, a silicon nitride oxide film or the like is formed by PE-CVD method. The thickness of the gate insulating film is usually 100 to 300 nm. An oxide semiconductor layer 4 on the gate insulating film is formed by means of a sputtering method, which forms a sputtering target having the same composition as the oxide semiconductor in DC sputtering or RF sputtering, or a liquid phase method, which forms the oxide semiconductor layer by applying a precursor solution of metal alkoxide, metal organic acid salt or chloride, or a dispersion of the oxide semiconductor nanoparticle and curing. After the oxide semiconductor layer 4 is patterned, source and drain electrodes 5 and 6 are formed. The source and drain electrodes material include materials such as molybdenum, aluminum and aluminum alloys, copper and copper alloys, and titanium, which is constituted as a single layer thereof or a laminate film of two or more types thereof.

When the siloxane composition used in the present invention is a photosensitive composition, a method for manufacturing a thin film transistor substrate comprises applying the photosensitive siloxane composition on a thin film transistor having the oxide semiconductor layer described above, drying by prebake etc., thereafter exposing, developing with aqueous solution of tetramethylammonium hydroxide (generally, 2.38% aqueous solution is used) to form a pattern such as a contact hole, thereafter curing the coated photosensitive siloxane composition (protective film precursor layer) to form a protective film 7, then conducting additional heat treatment, and further conducting annealing treatment of the oxide semiconductor. Furthermore, an ITO film is formed on the protective film, for example, by sputtering method and patterned to form the device of FIG. 3. Further, on this protective film, it is possible to form an inorganic film by CVD or PVD and to have an organic material for the purpose of a protective film or planarization by coating method. The annealing treatment may be conducted after the ITO film or the like is formed.

Each step of the manufacturing method according to the present invention is described below.

(1) Step of Preparing a Siloxane Composition

In the method for manufacturing a thin film transistor substrate according to the present invention, a siloxane composition comprising polysiloxane, a fluorine-containing compound and a solvent is prepared. The details of each constituent component of the siloxane composition are as described above.

(2) Step of Forming a Protective Film Precursor Layer

A protective film precursor layer is formed by applying the siloxane composition described above. The coating step in the present invention is carried out by applying the siloxane composition described above on the thin film transistor surface. This coating step can be carried out by ordinary coating methods, i.e., any method known as a method for coating a conventional composition, such as dip coating, roll coating, bar coating, brush coating, spray coating, doctor coating, flow coating, spin coating and slit coating. By applying repeatedly one or more times if necessary, it becomes possible to get a protective film precursor layer with the desired thickness.

To reduce the remaining solvent amount in the protective film precursor layer, it is preferable to prebake the layer (preheating treatment). The prebaking step can be performed generally at 70 to 150° C., preferably at the temperature of 90 to 130° C., for 10 to 180 seconds, preferably 30 to 90 seconds in the case of hot plate, and for 1 to 5 minutes in the case of clean oven. It is preferred to include a step of removing the solvent by spinning or vacuum prior to prebaking.

(3) Step of Conducting Thermal Curing of the Protective Film Precursor Layer to Form a Protective Film The curing temperature of the protective film precursor layer is not particularly limited and can be freely selected if it is the temperature at which dehydration condensation of siloxane proceeds. When the curing temperature is too low, the reaction does not proceed sufficiently and silanol groups remain in the protective film, which may affect the stability of transistor performance. Therefore, the firing temperature is preferably 200° C. or higher, more preferably 250° C. or higher.

Further, when the temperature is too high, the production cost increases and the polymer may be decomposed, so that it is preferred to be 500° C. or lower, more preferably 400° C. or lower. Further, although the curing time is not particularly limited, but it is generally 10 minutes or more, preferably 20 minutes or more. The curing is carried out in an inert gas or under an oxygen-containing atmosphere such as in atmosphere.

By such a thermal curing treatment, polysiloxane contained in the protective film precursor layer is cured to form a protective film.

(4) Step of Further Conducting Additional Heating of the Formed Protective Film

After curing polysiloxane to form a protective film, an additional heating step is carried out. The additional heating may be done at any time if it is after the thermal curing and before the annealing treatment. When chemical reaction (polymerization) of siloxane occurs at the stage of annealing treatment, water is generated, which affects transistor performance, so that it is preferable to conduct the additional heating at the same as or higher temperature than the temperature of the annealing treatment. Further, the additional heating can be conducted by heating at the same as or higher temperature than the heating temperature in the step of forming the cured film described above. Particularly, when an organic material is used, it is preferable to conduct the thermal curing once at the same as or lower temperature than the additional heating temperature not to be decomposed. However, the upper limit of the additional heating temperature is, like the curing step, preferably 500° C. or lower, more preferably 400° C. or lower, from the viewpoint of production cost and prevention of polymer decomposition. Moreover, the additional heating time is generally 20 minutes or more, preferably 40 minutes or more. Like the thermal curing, atmosphere, in which the additional heating treatment is conducted, is in an inert gas atmosphere or under an oxygen-containing atmosphere. However, it is also possible to conduct the additional heating in different atmosphere from that in the thermal curing step.

(5) Step of Annealing the Thin Film Transistor to which the Protective Film is Formed Finally, the annealing treatment of the thin film transistor is conducted. In the device comprising an oxide semiconductor, the protective film formation contains a step of forming a film by PVD or CVD, a step of patterning by dry etching or wet etching, a step of removing a resist, and the like. Since deterioration of the thin film transistor performance may occur at this time, it is desirable to recover the performance by the annealing treatment. In the present invention, by conducting the annealing treatment, for example, at 250° C. or higher, it is possible to recover its performance, even when the performance of the thin film transistor is deteriorated once at the time of patterning. Particularly, in the present invention, even when performance of the thin film transistor is remarkably deteriorated, there is characteristics that significant recovery of the performance occurs by annealing in the presence of oxygen. Further, depending on the deterioration degree of the oxide semiconductor, the performance recovery of the thin film transistor and the reliability of the device can be improved by raising the annealing temperature or prolonging the annealing time. The annealing temperature is 250° C. or higher and 450° C. or lower, preferably 300° C. or higher and 400° C. or lower. The annealing time is 30 minutes or more, preferably 60 minutes or more. The annealing is preferably performed in the presence of oxygen. However, the annealing in the presence of oxygen is preferably performed at 400° C. or lower in consideration of the influence of coloration etc. due to oxidation of the electrode or oxidation of the protective film of the present invention.

In addition, the additional heat treatment and annealing described above can be carried out as a series of treatments. Specifically, it is possible to perform heating under the same conditions continuously from the additional heating step to the annealing step. In such a case, compared with the annealing process that is generally performed, prolonged heating is conducted.

In addition, although the step of forming a protective film, the step of additional heating and the step of the annealing treatment can be carried out continuously, it is also possible to carry out another step in between these steps. For example, as described above, in between the additional heating and annealing treatment, it is also possible to form another layer on the protective film.

By the above method, it is possible to manufacture a thin film transistor substrate.

In addition, it is also possible to form a protective film having a pattern by adding a photosensitizer to the siloxane composition. To form such a protective film, the following steps can be added. The following steps are preferably performed after pre-baking.

<Exposure Step>

After forming the protective film precursor layer, light irradiation is conducted to the surface thereof. As the light source used for the light irradiation, any of those conventionally used in the pattern forming process can be used. Such a light source includes a high-pressure mercury lamp, a low-pressure mercury lamp, a lamp of metal halide, xenon or the like, laser diode, LED, and the like. As the irradiation light, ultraviolet ray such as g-line, h-line and i-line is usually used. Except for ultra-fine processing such as for semiconductor, it is general to use light (high-pressure mercury lamp) of 360 to 430 nm for the pattern of from several μm to several tens μm. Above all, in the case of liquid crystal display devices, light of 430 nm is often used. Although the energy of the irradiation light depends on light source or thickness of the protective film precursor layer, it is defined to be 20 to 2,000 mJ/cm$^2$, preferably 50 to 1,000 mJ/cm$^2$ in the case of the positive type of diazonaphthoquinone derivative. When the irradiation light energy is less than 20 mJ/cm$^2$, enough resolution may not be obtained, and on the contrary, when it is higher than 2,000 mJ/cm$^2$, this results in excessive exposure, which may lead to occurrence of halation. Furthermore, in the case of negative type, it is defined to be 1 to 500 mJ/cm$^2$, preferably 10 to 100 mJ/cm$^2$. When the irradiation light energy is less than 1 mJ/cm$^2$, reduction in film thickness is large, and on the contrary, when it is higher than 500 mJ/cm$^2$, this results in excessive exposure, and resolution may not be obtained.

In order to irradiate the light in a pattern, common photomasks can be used. Such a photomask can be freely selected from known ones. Although environment at the time of irradiation is not particularly limited, it may be, in general, the ambient atmosphere (in the air) or nitrogen atmosphere. Further, in the case of forming a film on the entire surface of the substrate, the light can be irradiated on the entire surface of the substrate. In the present invention, the pattern film also includes the case where a film is formed on such an entire surface of the substrate.

<Post Exposure Baking Step>

After exposing, post exposure baking can be optionally performed in order to promote the inter-polymer reaction in the film by a reaction initiator generated in the exposed portion. This baking treatment is performed in order not to completely cure the protective film precursor layer but to leave only a desired pattern after development on the substrate and make it possible to remove the other portion by development.

<Development Step>

After exposing, optionally after performing the post exposure baking, the protective film precursor layer is developed. As the developer to be used for the development, any developer used for the development of conventional known photosensitive siloxane composition can be used. Preferred developer includes alkali developers that are aqueous solutions of an alkaline compound such as tetraalkyl ammonium hydroxide, choline, alkali metal hydroxide, alkali metal metasilicate (hydrate), alkali metal phosphate (hydrate), ammonia, alkylamine, alkanolamine and heterocyclic amine, and particularly preferred alkali developer is aqueous TMAH solution. These alkaline developers may optionally further contain a water-soluble organic solvent such as methanol and ethanol, or a surfactant. Developing method can also be freely selected from conventionally known methods. Specifically, it includes methods such as immersion in a developer (dip), paddle, shower, slit, cap coat, and spray. A pattern can be obtained by this development. After the development is performed by a developer, it is preferable that water rinsing is performed. In addition, in the manufacturing method according to the present invention, as shown in FIG. 3, it is also possible to electrically connect the drain electrode 6 to a transparent electrode (pixel electrode 8) formed on the protective film 7 through a contact hole 9 formed by the development.

<Post Development Irradiating Step>

When using a positive type composition and using the protective film to be formed, as a transparent film, it is preferable to perform light irradiation which is called bleaching exposure. By performing the bleaching exposure, unreacted diazonaphthoquinone derivative which remained in the film is decomposed by light and optical transparency of the film is further improved. In the bleaching exposure method, using high-pressure mercury lamp, a low-pressure mercury lamp and the like, about 100 to 2,000 mJ/cm$^2$ of exposure (in terms of exposure amount at a wavelength of 365 nm), which depends on the thickness, is performed on the entire surface. Further, in the case of negative type, through activating by the light irradiation the curing promoter in the remaining film after the development, subsequent thermal curing can be performed more easily. About 100 to 2,000 mJ/cm$^2$ of exposure (in terms of exposure amount at a wavelength of 365 nm), which depends on the thickness, is performed on the entire surface.

EXAMPLES

The present invention is specifically described below with reference to the examples.

Synthesis Example (Synthesis of Polysiloxane (P1)

In a 2 L flask equipped with a stirrer, a thermometer and a condenser tube, 24.5 g of 25 mass % aqueous solution of tetramethylammonium hydroxide (TMAH), 300 ml of isopropyl alcohol (IPA), 2.0 g of water were charged, and then a mixed solution of 39.7 g of phenyltrimethoxysilane and 40.8 g of methyltrimethoxysilane was prepared in a dropping funnel. The mixed solution was dropped at 60° C., and after stirring for 3 hours at the same temperature, it was neutralized by adding 10% aqueous solution of HCl. 200 ml of toluene and 300 ml of water were added in the neutralized solution, which could be separated into two layers, the solvent was removed by concentrating the resulting organic layer under reduced pressure, and propylene glycol monomethyl ether acetate (PGMEA) was added to the concentrate, which is prepared to become 40 mass % of solid content concentration. The molecular weight (in terms of polystyrene) of the resulting polysiloxane (P1) was mass-average molecular weight (Mw)=2,000. The resulting resin solution was coated on the silicon wafer to get the film thickness after prebaking of 2 μm, and when dissolution rate in 5% aqueous solution of TMAH was measured, it was 950 Å/sec.

Synthesis Examples (Syntheses of Polysiloxane (P2 to P4))

Polysiloxane P2 to P4 were obtained in the same manner as in the synthesis example of P1 with the exception that the silane compound used in the polysiloxane synthesis was changed. Details of polysiloxane P2 to P4 were as shown in Table 1 below.

TABLE 1

| Polysiloxane | | Raw materials (silane compounds) | | | | Mass average molecular weight | Dissolution rate Å/second |
|---|---|---|---|---|---|---|---|
| | | Methyltrimethoxysilane mol % | Phenyltrimethoxysimane mol % | Nonafluorohexyl trimethoxysilane mol % | Tetramethoxysilane mol % | | |
| P1 | | 60 | 40 | — | — | 2000 | 950 (5% TMAH) |
| P2 | | 60 | 30 | 10 | — | 2200 | 400 (2.38% TMAH) |
| P3* | P3-1(90) | 50 | 40 | — | 10 | 1800 | 1200 (2.38% TMAH) |
| | P3-2(10) | 50 | 40 | — | 10 | 2500 | 300 (5% TMAH) |
| P4 | | 60 | — | 40 | — | 3500 | 700 (2.38% TMAH) |

In the table, P3 is a mixture of P3-1 and P3-2, prepared by mixing them at 90:10 (mass ratio).

Preparation of Siloxane Composition

With the polysiloxane P1 to P4, various additives were combined to prepare siloxane compositions of Examples 1 to 5 and Comparative Examples 1 to 3. Constitution of each composition was as shown in Table 2. In addition, in the table, the addition amounts of the dinaphthoquinone compound and the curing promoter are amounts for 100 parts by mass of polysiloxane, and those of other additives are amounts based on the mass of the entire composition.

Production of Thin Film Transistor Substrate

A silicon oxide film of 100 nm was placed on a n-doped silicon wafer as a gate insulating film. An amorphous InGaZnO film was formed (70 nm) on the gate insulating film by RF sputtering method. After forming a pattern of the amorphous InGaZnO film, the source and drain electrodes were patterned. As the material for the source and drain electrodes, molybdenum was utilized. Thereafter, annealing of the thin film transistor was carried out at 300° C. for 1 hour. Subsequently, the prepared siloxane composition was applied by spin coating method. Prebaking was carried out at 100° C. for 90 seconds.

Then, curing was carried out in an oxygen atmosphere at 300° C. for 60 minutes to form a protective film. Furthermore, the additional heat treatment and annealing were combinedly carried out in an oxygen atmosphere at 300° C. for 120 minutes to obtain a thin film transistor substrate comprising a protective film. Film thickness of the protective film was 1,000 nm.

With respect to the obtained substrate, the characteristic values thereof were measured. The obtained results were as shown in Table 2.

TABLE 2

| | Polysiloxane | DNQ* | Curing aid | Surfactant | Other additives | Curing condition | Additional heating/annealing condition | Bias stress | Carrier mobility | Hump phenomenon |
|---|---|---|---|---|---|---|---|---|---|---|
| Example 1 | P1 | — | TBG* 0.05 parts | R-2011 3000 ppm | — | 300° C./60 min in the air | 300° C./120 min in O2 | 0.2 ± 0.4 | 10.20 ± 0.89 | A |
| Example 2 | P1 | — | TBG 0.05 parts | AKS10 5000 ppm | NFH 10 parts | 300° C./60 min in the air | 300° C./120 min in O2 | −0.8 ± 0.14 | 10.60 ± 1.86 | B |
| Example 3 | P2 | — | TBG 0.05 parts | F-558 5000 ppm | — | 300° C./60 min in the air | 300° C./120 min in O2 | −0.4 ± 0.5 | 11.24 ± 1.38 | B |
| Example 4 | P3 | 9 parts | DTS-200* 1.5 parts | AKS10 3000 ppm | — | 250° C./60 min in N2 | 300° C./120 min in O2 | −0.15 ± 0.07 | 10.11 ± 0.72 | A |
| Example 5 | P4 | — | TBG 0.05 parts | F-558 5000 ppm | — | 300° C./60 min in the air | 300° C./120 min in O2 | −0.8 ± 0.28 | 9.49 ± 0.30 | B |
| Comparative Example 1 | P1 | — | TBG 0.05 parts | AKS10 3000 ppm | — | 300° C./50 mm in the air | 300° C./120 min in O2 | −3.9 ± 0.4 | 0.94 ± 1.97 | C |
| Comparative Example 2 | P3 | 9 parts | TPS-1000 1 parts | AKS10 3000 ppm | — | 250° C./60 min in N2 | 300° C./120 min in O2 | −1.20 ± 0.2 | 9.58 ± 0.54 | C |
| Comparative Example 3 | P1 | — | TBG 0.05 parts | AKS10 3000 ppm | P2 50000 ppm | 300° C./60 min in the air | 300° C./120 min in O2 | unmeasurable | unmeasurable | D |

In the table,

DNQ: a product of 4-4'-(1-(4-(1-(4-hydroxy-phenol)-1-methylethyl)-phenyl)ethylidene)bisphenol modified with 2.0 mol of diazonaphthoquinone; the addition amount is based on 100 parts by mass of polysiloxane TBG: 1,8-diazabicyclo[5.4.0]undecene-7-ortho-phthalic acid salt; the addition amount is based on 100 parts by mass of polysiloxane DTS-200: trade name; manufactured by Midori Kagaku Co., Ltd.; sulfonium salt type photoacid generator; counterion $B(C_6F_5)_4^-$; the addition amount is based on 100 parts by mass of polysiloxane TPS-1000: trade name; manufactured by Midori Kagaku Co., Ltd.; sulfonium salt type photoacid generator; counterion $CH_3C_6HSO_3^-$; the addition amount is based on 100 parts by mass of polysiloxane AKS10: trade name; manufactured by Shin-Etsu Chemical Co., Ltd.; fluorine-free surfactant R-2011: trade name; manufactured by DIC Corporation; fluorine-based surfactant F-558: trade name; manufactured by DIC Corporation; fluorine-based surfactant NFH: nonafluorohexyl trimethoxysilane Following device characteristics were measured with semiconductor parameter analyzer, Agilent 4156C.

Method for Measuring Carrier Mobility

With drain voltage of 0.1 V and TFT size of channel width of 90 μm and channel length of 10 μm, the change of drain current for gate voltage from −20V to 20V was measured and carrier mobility (unit: cm$^2$/V·sec) was calculated.

Method for Measuring Bias Stress

Device characteristics was measured after performing stress application with gate voltage of −20V, drain voltage of 0V and application time of 10,000 seconds. Then, measurement was performed in the same way as the above-described carrier mobility except that the drain voltage was changed to 5V to evaluate how much the gate threshold voltage Vth from OFF to ON shifted from the initial state. The gate threshold voltage Vth is defined to be a value that has reached the drain current of 1 nA.

Evaluation of Hump Phenomenon

Evaluation how much the size of hump, which occurs in the vicinity of the threshold from OFF to ON, changed from the initial state after application of the above-described stress was made by the following criteria. It can be judged that the smaller this is, the better the switching characteristic is.

A: none
B: small
C: large
D: unmeasurable

EXPLANATION OF SYMBOLS

1 Thin film transistor substrate comprising protective film
2 gate layer
3 gate insulating layer
4 metal oxide semiconductor layer
5 source electrode
6 drain electrode
7 protective film
8 pixel electrode
9 contact hole

The invention claimed is:

1. A thin film transistor substrate comprising:
a thin film transistor; and
a protective film comprising a cured product of a siloxane composition, covering said thin film transistor,
wherein said thin film transistor has a semiconductor layer made of an oxide semiconductor,
wherein said siloxane composition comprises:
a polysiloxane;
a fluorine-containing compound which is a compound represented by the following formula (M):

$$R^4Si(OR^5)_3 \quad (M)$$

wherein
$R^4$ is a completely or partially fluorine-substituted hydrocarbon group having 1 to 8 carbon atoms, and
$R^5$ represents an alkyl group having 1 to 5 carbon atoms; and
a solvent, and where said polysiloxane comprises a repeating unit represented by the following general formula (Ia):

wherein
$R^1$ is hydrogen; a monovalent to trivalent, straight-chain, branched or cyclic, saturated or unsaturated, aliphatic hydrocarbon group having 1 to 30 carbon atoms; or a monovalent to trivalent, aromatic hydrocarbon group having 6 to 30 carbon atoms;
wherein in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxy group or an alkoxy group, and one or more carbons are unsubstituted or substituted with silicon; and
when $R^1$ is divalent or trivalent, $R^1$ connects the Si atoms to each other, which are included in a plurality of the repeating units.

2. The substrate according to claim 1, wherein said polysiloxane further comprises a repeating unit represented by the following general formula (Ib):

3. The substrate according to claim 2, wherein said polysiloxane comprises:
polysiloxane (I) obtained by hydrolysis and condensation of a silane compound represented by the following formula (ia) and a silane compound represented by the following formula (ib) in the presence of a basic catalyst:

$$R^{1'}[Si(OR^a)_3]_p \quad (ia)$$

$$Si(OR^a)_4 \quad (ib)$$

wherein
$R^{1'}$ is hydrogen; a monovalent to trivalent, linear, branched or cyclic, saturated or unsaturated, aliphatic hydrocarbon group having 1 to 30 carbon atoms; or a monovalent to trivalent, aromatic hydrocarbon group having 6 to 30 carbon atoms;
wherein in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxy group or an alkoxy group, and one or more carbons are unsubstituted or substituted with silicon; and R$^a$ represents an alkyl group having 1 to 10 carbon atoms,
wherein the film after prebaking of polysiloxane (I) is soluble in 5 mass % aqueous solution of tetramethylammonium hydroxide, and dissolution rate of the film is 1,000 Å/sec or less;

p is 1 to 3;

and polysiloxane (II) obtained by hydrolysis and condensation of at least of a silane compound represented by said formula (ia) in the presence of an acidic or basic catalyst, wherein the film after prebaking of polysiloxane (II) is soluble in 2.38 mass % aqueous solution of tetramethylammonium hydroxide, and dissolution rate of the film is 100 Å/sec or more.

4. The substrate according to claim 1, wherein said fluorine-containing compound is a photo sensitizer.

5. The substrate according to claim 4, wherein said photosensitizer further contains a photosensitizer that is free of fluorine atom.

6. The substrate according to claim 1, wherein in said siloxane composition, the ratio of the number of fluorine atoms derived from said fluorine-containing compound to the number of silicon atoms derived from said polysiloxane is 0.002 to 0.4.

7. The substrate according to claim 1, wherein said siloxane composition is a positive type photosensitive siloxane composition comprising at least two types of polysiloxane having different alkali dissolution rate, a diazonaphthoquinone derivative, a fluorine-containing compound and a solvent.

8. The substrate according to claim 1, having a second protective film on said protective film.

9. A method for manufacturing the thin film transistor substrate according to claim 1, which comprises:
a step of preparing a siloxane composition comprising polysiloxane, a fluorine-containing compound and a solvent, wherein said polysiloxane comprises a repeating unit represented by the following general formula (Ia):

(Ia)

where

R$^1$ is hydrogen a monovalent to trivalent, straight-chain, branched or cyclic, saturated or unsaturated, aliphatic hydrocarbon group having 1 to 30 carbon atoms; or a monovalent to trivalent, aromatic hydrocarbon group having 6 to 30 carbon atoms;
wherein in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxy group or an alkoxy group, and one or more carbons are unsubstituted or substituted with silicon; and
when R$^1$ is divalent or trivalent, R$^1$ connects the Si atoms to each other, which are included in a plurality of the repeating units;

a step of coating a thin film transistor with said siloxane composition to form a protective film precursor layer;

a step of conducting thermal curing of said protective film precursor layer to form a protective film;

a step of conducting additional heating of the formed protective film; and a step of subjecting the thin film transistor comprising said protective film to annealing treatment.

10. The method according to claim 9, wherein said additional heating is conducted at the same as or higher temperature than the temperature of said thermal curing.

11. The method according to claim 9, wherein said additional heating is conducted at the same as or higher temperature than the temperature of said annealing treatment.

12. The method according to claim 9, wherein said annealing treatment is conducted at 250° C. or higher and at 450° C. or lower.

13. The method according to claim 9, wherein said annealing treatment is conducted in an oxygen atmosphere.

14. A siloxane composition for manufacturing a thin film transistor substrate comprising:

a polysiloxane;

a fluorine-containing compound which is a compound represented by the following formula (M):

(M)

wherein

R$^4$ is a completely or partially fluorine-substituted hydrocarbon group having 1 to 8 carbon atoms, and R$^5$ represents an alkyl group having 1 to 5 carbon atoms; and a solvent, wherein said polysiloxane comprises a repeating unit represented by the following general formula (Ia):

(Ia)

where

R$^1$ is hydrogen; a monovalent to trivalent, straight-chain, branched or cyclic, saturated or unsaturated, aliphatic hydrocarbon group having 1 to 30 carbon atoms; or a monovalent to trivalent, aromatic hydrocarbon group having 6 to 30 carbon atoms;
wherein in said aliphatic hydrocarbon group and said aromatic hydrocarbon group, one or more methylene groups are unsubstituted or substituted with an oxy group, an imide group or a carbonyl group, one or more hydrogens are unsubstituted or substituted with fluorine, a hydroxyl group or an alkoxy group, and one or more carbons are unsubstituted or substituted with silicon; and
when R$^1$ is divalent or trivalent, R$^1$ connects the Si atoms to each other, which are included in a plurality of the repeating units.

15. The composition according to claim 14, wherein the ratio of the number of fluorine atoms derived from said fluorine-containing compound to the number of silicon atoms derived from said polysiloxane is 0.002 to 0.4.

* * * * *